US012808941B2

United States Patent
Heo et al.

(12) United States Patent
(10) Patent No.: US 12,808,941 B2
(45) Date of Patent: Nov. 24, 2026

(54) HIGH-SPEED BATTERY DEFECT INSPECTION METHODS

(71) Applicant: LG Energy Solution, Ltd., Seoul (KR)

(72) Inventors: Yeonhyuk Heo, Daejeon (KR); Eun Ju Lee, Daejeon (KR); Kihyun Son, Daejeon (KR); Du Hyeon Shin, Daejeon (KR); Gyo Hyun Hwang, Daejeon (KR); Hyuk Kim, Daejeon (KR); Kyun Il Rah, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 268 days.

(21) Appl. No.: 18/839,658

(22) PCT Filed: Jul. 20, 2023

(86) PCT No.: PCT/KR2023/010458
§ 371 (c)(1),
(2) Date: Aug. 19, 2024

(87) PCT Pub. No.: WO2024/090724
PCT Pub. Date: May 2, 2024

(65) Prior Publication Data
US 2026/0243837 A1 Aug. 20, 2026

(30) Foreign Application Priority Data
Oct. 28, 2022 (KR) ........................ 10-2022-0140870

(51) Int. Cl.
*G01R 31/389* (2019.01)
*H01M 4/04* (2006.01)

(52) U.S. Cl.
CPC ........ *G01R 31/389* (2019.01); *H01M 4/0447* (2013.01)

(58) Field of Classification Search
CPC ........................... G01R 31/389; H01M 4/0447
USPC ........................................................ 324/430
See application file for complete search history.

(56) References Cited

U.S. PATENT DOCUMENTS 11,264,599 B2 3/2022 Kim et al.
2007/0090843 A1* 4/2007 De Doncker ........ G01R 31/389 324/426
2012/0182020 A1 7/2012 Akutsu et al.
2013/0030596 A1* 1/2013 Okada .................. G01R 31/389 700/297
2020/0326380 A1* 10/2020 Wuebbeler ........... G01R 31/374
2020/0408844 A1 12/2020 Ogasawara et al.
2021/0123815 A1* 4/2021 Boss .................... G01R 31/389
2022/0077491 A1 3/2022 Kim et al.
2022/0206076 A1* 6/2022 Morrison ............... G01R 27/02
(Continued)

FOREIGN PATENT DOCUMENTS

CN 103884995 A 6/2014
CN 104914312 A 1/2018
(Continued)

*Primary Examiner* — Christopher P McAndrew
(74) *Attorney, Agent, or Firm* — Bryan Cave Leighton Paisner LLP

(57) ABSTRACT

Provided are high-speed battery defect inspection methods. For example, provided are high-speed battery defect inspection methods for determining, in a short time, whether a battery formed by stacking a plurality of monocells is defective, by predicting the degradation characteristics of the battery.

13 Claims, 3 Drawing Sheets

(56) References Cited

U.S. PATENT DOCUMENTS

| | | | | |
|---|---|---|---|---|
| 2022/0299573 | A1 | 9/2022 | Tanaka et al. | |
| 2022/0317191 | A1* | 10/2022 | Munakata | G01R 31/367 |
| 2023/0084079 | A1 | 3/2023 | Kwak | |
| 2023/0168292 | A1 | 6/2023 | Bae et al. | |
| 2023/0393202 | A1* | 12/2023 | Onuki | B60L 3/0046 |
| 2023/0393215 | A1* | 12/2023 | Bao | G01R 31/367 |
| 2024/0036115 | A1 | 2/2024 | Park | |
| 2024/0085485 | A1* | 3/2024 | Roemersperger | G01R 31/367 |

FOREIGN PATENT DOCUMENTS

| | | | |
|---|---|---|---|
| CN | 111537904 | A | 8/2020 |
| JP | 2000-030763 | A | 1/2000 |
| JP | 2007333494 | A | 12/2007 |
| JP | 2010-135290 | A | 6/2010 |
| JP | 2011252930 | A | 12/2011 |
| JP | 2015094726 | A | 5/2015 |
| JP | 2016065832 | A | 4/2016 |
| JP | 2016085062 | A | 5/2016 |
| JP | 2016090346 | A | 5/2016 |
| JP | 6436271 | B2 | 11/2018 |
| JP | 2019-015664 | A | 1/2019 |
| JP | 2013170862 | A | 9/2019 |
| JP | 2020-205253 | A | 12/2020 |
| JP | 2021077569 | A | 5/2021 |
| JP | 2022-108675 | A | 7/2022 |
| JP | 2022533496 | A | 7/2022 |
| JP | 2022139501 | A | 9/2022 |
| JP | 2022-143766 | A | 10/2022 |
| KR | 10-2014-0080342 | A | 6/2014 |
| KR | 10-2022-0039452 | A | 3/2022 |
| KR | 10-2022-0068806 | A | 5/2022 |
| KR | 10-2022-0093842 | A | 7/2022 |
| WO | 2022108111 | A1 | 5/2022 |

* cited by examiner

HIGH-SPEED BATTERY DEFECT INSPECTION METHODS

CROSS-REFERENCE TO RELATED APPLICATIONS

This application is a National Phase entry pursuant to 35 U.S.C. § 371 of International Application No. PCT/KR2023/010458 filed on Jul. 20, 2023, which claims priority to and the benefit of Korean Patent Application No. KR 10-2022-0140870, filed on Oct. 28, 2022. The contents of the above-identified applications are herein incorporated by reference in their entireties.

FIELD OF THE INVENTION

The present disclosure relates to high-speed battery defect inspection methods, and more particularly, to high-speed battery defect inspection methods for determining a battery defect in a short time by predicting deterioration characteristics of a battery formed by stacking a plurality of monocells.

BACKGROUND

In the case of a medium or large-sized battery in which a plurality of monocells are stacked, there is a problem in that some monocells inside exhibit a low-voltage defect phenomenon (a phenomenon in which the potential of a specific monocell decreases) for which the cause is unknown, and a defect phenomenon in which the capacity of all cells degrades.

Products, such as ESSs and vehicle batteries equipped with low-voltage defective cells which are shipped, exhibit significant instability in performance over a long period of time and may reduce product reliability.

Conventionally, battery voltage tracking is performed to detect low-voltage defective batteries in a battery shipping stage. In the case of battery voltage tracking, it generally took a long time of 2 weeks or more. In addition, there is a high pressure current detection (HPCD) inspection method that considers the main cause of the low-voltage defect as the folding phenomenon of the separator, but there is a limit to detecting by the HPCD inspection method.

Therefore, there is a need for an inspection method capable of detecting low-voltage defective cells with novel inspection methods and simultaneously inspecting all of the cells in a short time.

The background description provided herein is for the purpose of generally presenting context of the disclosure. Unless otherwise indicated herein, the materials described in this section are not prior art to the claims in this application and are not admitted to be prior art, or suggestions of the prior art, by inclusion in this section.

SUMMARY

The present disclosure relates to high-speed battery defect inspection methods, and more particularly, provides high-speed battery defect inspection methods by predicting deterioration characteristics of a battery formed by stacking a plurality of monocells and determining a battery defect in a short time.

Technical objects to be achieved by the present disclosure are not limited to the technical objects mentioned above, and other technical objects not mentioned will be clearly understood by those skilled in the art from the description below.

A high-speed battery defect inspection method may comprise obtaining an analysis target impedance, wherein the analysis target impedance is an impedance of an analysis target battery measured by applying an alternating current at a set frequency to the analysis target battery; extracting a real part resistance from the analysis target impedance; and determining a defect of the analysis target battery based on the real part resistance, wherein the set frequency is selected from frequencies in which an imaginary part value of the analysis target impedance is greater than 0.

A high-speed battery defect inspection method may further comprise a set frequency between $10^{-2}$ kHz and 7 MHz.

A high-speed battery defect inspection method may further comprise an analysis target battery comprising a plurality of monocells.

A high-speed battery defect inspection method may further comprise prior to obtaining the analysis target impedance: obtaining a plurality of reference impedances by applying an alternating current to a reference battery at varying frequencies; and calculating the set frequency based on the plurality of reference impedances.

A high-speed battery defect inspection method may further comprise a reference battery having a dOCV of 300 mV or greater or three sigma or more.

In a high-speed battery defect inspection method, calculating the set frequency based on the plurality of reference impedances may further comprise: separating the plurality of reference impedances into real part values $Z_{SR}$ and imaginary part values $Z_{SI}$; fitting a function $f$ to relate the real part values $Z_{SR}$ to the imaginary part values $Z_{SI}$; and obtaining the set frequency based on the function $f$.

A high-speed battery defect inspection method may further comprise a function $f$ relating the real part values $Z_{SR}$ to the imaginary part values $Z_{SI}$ as:

$$Z_{SR} = f(Z_{SI}).$$

In a high-speed battery defect inspection method obtaining a set frequency based on the function $f$, the set frequency may be selected from frequencies satisfying an equation:

$$-\varepsilon \leq \frac{df(Z_{SI})}{dZ_{SI}} \leq \varepsilon,$$

wherein ε is between 0.0 and 0.2, and a value of $Z_{SI}$ is greater than 0.

In a high-speed battery defect inspection method & may be equal to 0.

In a high-speed battery defect inspection method, in determining the defect of the analysis target battery based on the real part resistance, the analysis target battery may be determined as a defective battery when the real part resistance is at least 30% greater than an imaginary part value $Z_{SI}$ satisfying an equation $$-\varepsilon \leq \frac{df(Z_{SI})}{dZ_{SI}} \leq \varepsilon.$$

A battery activation method may comprise: assembling an activation target battery; charging the activation target battery or discharging the activation target battery; stabilizing the activation target battery by storing the activation target battery for a predetermined period of time at a set temperature and a set humidity; and determining a defect of the activation target battery according to a high-speed battery defect inspection method of the present disclosure.

In a battery activation method, between assembling the activation target battery and charging or discharging the activation target battery, may further comprise: pre-inspecting the activation target battery by determining a defect of the activation target battery according to a high-speed battery defect inspection method of the present disclosure.

In a battery activation method, determining the defect of the activation target battery may occur between assembling the activation target battery and charging the activation target battery or discharging the activation target battery.

A high-speed battery defect inspection method of the present disclosure may detect low-voltage defective batteries in a short time, and may be capable of inspecting thousands to tens of thousands of batteries per second.

The high-speed battery defect inspection method of the present disclosure is capable of performing non-destructive inspection on finished batteries, and may be applicable to batteries in mass production lines and batteries that have already been produced.

Compared to conventional methods, the high-speed battery defect inspection methods of the present disclosure significantly reduce inspection time, and may be capable of determining defects even in batteries that have not been inspected.

BRIEF DESCRIPTION OF DRAWINGS

The accompanying drawings illustrate various embodiments of the present disclosure and together with the foregoing disclosure, serve to provide further understanding of the technical features of the present disclosure, and thus, the present disclosure is not construed as being limited to the drawings.

DETAILED DESCRIPTION

Figure 1:
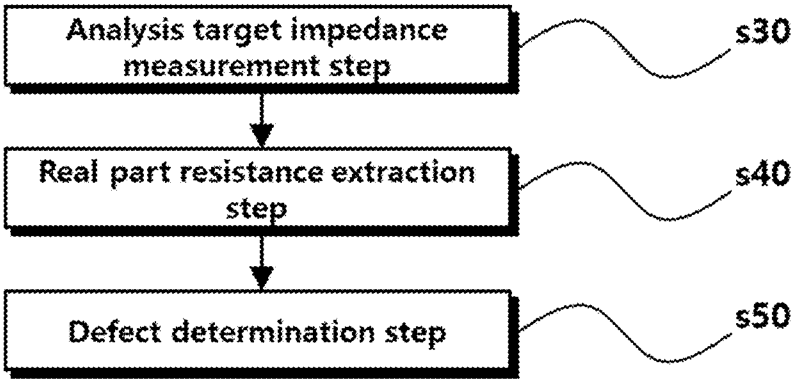
FIG. 1 is a block diagram illustrating a high-speed battery defect inspection method of the present disclosure.

A high-speed battery defect inspection method of the present disclosure may include

- an analysis target impedance measurement step (s30) of obtaining an analysis target impedance which is impedance of an analysis target battery measured by applying an alternating current at a set frequency to the analysis target battery;
- a real part resistance extraction step (s40) of extracting a real part value as a real part resistance from the analysis target impedance; and
- a defect determination step (s50) of determining a defect of the analysis target battery based on the real part resistance,
- wherein the set frequency is selected from frequencies in which an imaginary part value of the analysis target impedance is greater than 0.

In the high-speed battery defect inspection method of the present disclosure, the set frequency may be from $10^{-2}$ kHz to 7 MHz.

In the high-speed battery defect inspection method of the present disclosure, the analysis target battery may include a plurality of monocells.

The high-speed battery defect inspection method of the present disclosure may further include

- prior to the analysis target impedance measurement step (s30),
- a reference impedance measurement step (s10) of obtaining a plurality of reference impedances by applying an alternating current to a reference battery at varying frequencies; and
- a set frequency calculation step (s20) of calculating the set frequency based on the plurality of reference impedances.

In the high-speed battery defect inspection method of the present disclosure, the reference battery may have a dOCV of 300 mV or greater or three sigma or more.

In the high-speed battery defect inspection method of the present disclosure, the set frequency calculation step (s20) may include a variable separation step (s21) of separating the plurality of reference impedances into real part values $Z_{SR}$ and imaginary part values $Z_{SI}$, a function fitting step (s22) of obtaining a function $f$ to relate the real part values $Z_{SR}$ to the imaginary part values $Z_{SI}$, and a set frequency acquisition step (s23) of obtaining the set frequency based on the function.

In the function fitting step (s22) of the high-speed battery defect inspection method of the present disclosure, the function $f$ may relates the real part values $Z_{SR}$ to the imaginary part values $Z_{SI}$ as an equation of Formula 1 below.

$$Z_{SR} = f(Z_{SI}). \quad \text{[Formula 1]}$$

In the set frequency acquisition step (s23) of the high-speed battery defect inspection method of the present disclosure, the set frequency may be selected from frequencies satisfying an equation of Formula 2 below.

$$-\varepsilon \le \frac{df(Z_{SI})}{dZ_{SI}} \le \varepsilon \quad \text{[Formula 2]}$$

wherein ε is 0.0 to 0.2, and a value of $Z_{SI}$ is greater than 0.

In the set frequency acquisition step of the high-speed battery defect inspection method of the present disclosure, ε may be 0.

In the defect determination step (s50) of the high-speed battery defect inspection method of the present disclosure, the analysis target battery may be determined as a defective battery when the real part resistance is at least 30% greater than the $Z_{SI}$ value satisfying the Formula 2.

A battery activation method of the present disclosure may include

- an activation battery preparation step of preparing an activation target battery through an assembly process;
- a charging/discharging step of charging or discharging the activation target battery;
- a stabilization step of stabilizing the activation target battery by storing the activation target battery for a predetermined period of time at a set temperature and a set humidity; and a defect screening step of finally screening defective batteries by performing the high-speed battery defect inspection method using the activation target battery as the analysis target battery.

The battery activation method of the present disclosure may further include between the activation battery preparation step and the charging/discharging step, a pre-inspection step of pre-inspecting the activation target battery by performing the high-speed battery defect inspection method using the activation target battery as the analysis target battery.

Hereinafter, embodiments according to the present disclosure will be described in detail with reference to the accompanying drawings. In this process, the size or shape of the components shown in the drawings may be exaggerated for clarity and convenience of explanation.

Figure 2:
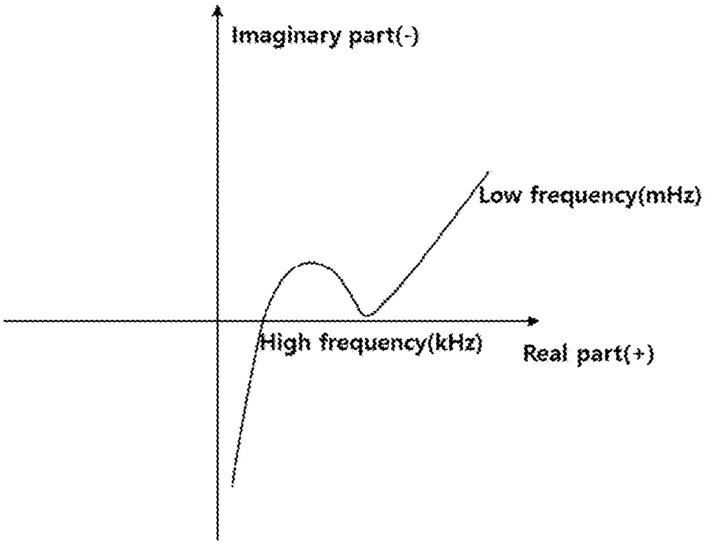
FIG. 2 is a graph illustrating a general Nyquist diagram.
Figure 3:
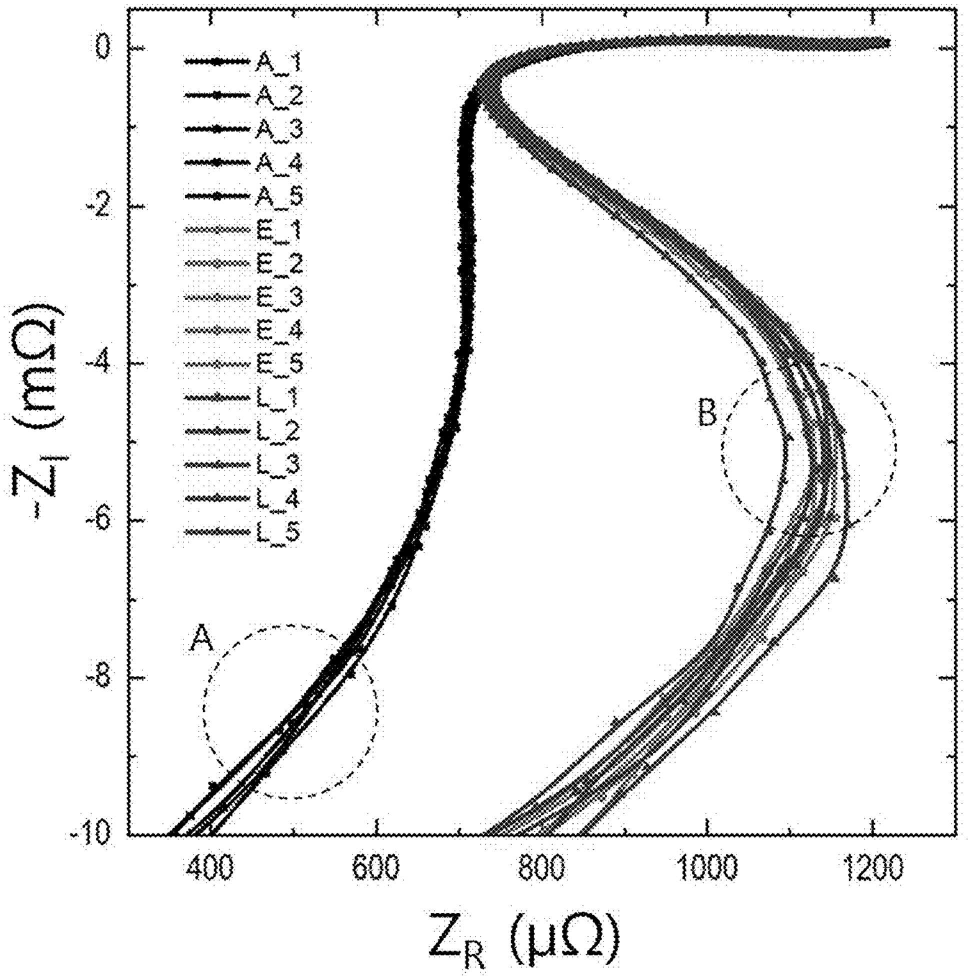
FIG. 3 is a graph comparing impedance values of a normal battery and a defective battery.
Figure 4:
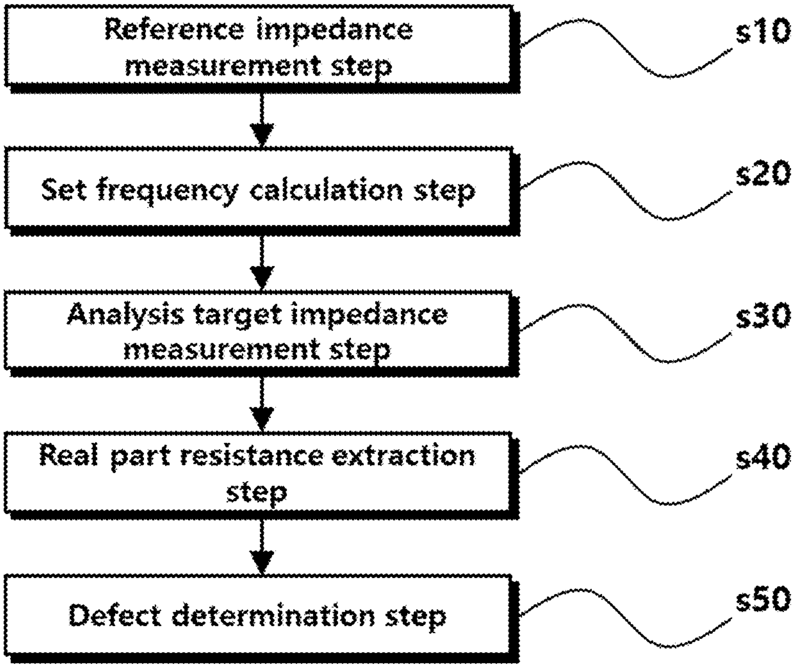
FIG. 4 is a block diagram illustrating another embodiment of a high-speed battery defect inspection method of the present disclosure.
Figure 5:
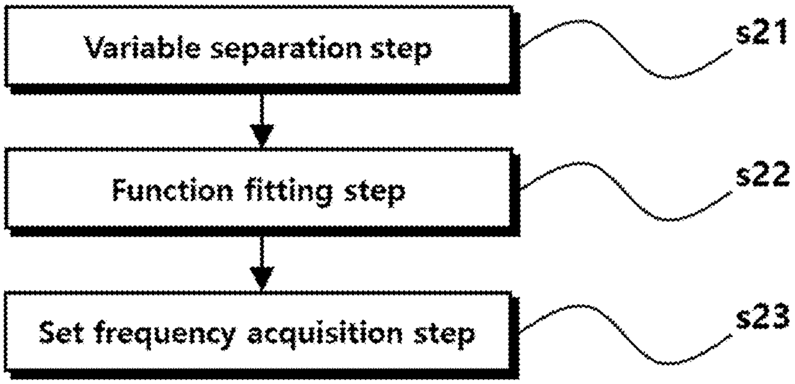
FIG. 5 is a block diagram illustrating a set frequency step.

FIG. 1 is a block diagram illustrating a high-speed battery defect inspection method of the present disclosure. FIG. 2 is a graph illustrating a general Nyquist diagram. FIG. 3 is a graph comparing impedance values of a normal battery and a defective battery. FIG. 4 is a block diagram illustrating another embodiment of a high-speed battery defect inspection method of the present disclosure. FIG. 5 is a block diagram illustrating a set frequency step.

Hereinafter, with reference to FIGS. 1 to 5, high-speed battery defect inspection methods of the present disclosure will be described in detail.

As shown in FIG. 1, a high-speed battery defect inspection method of the present disclosure may include an analysis target impedance measurement step (s30) of obtaining an analysis target impedance which is an impedance of an analysis target battery by applying an alternating current at a set frequency to the analysis target battery;

a real part resistance extraction step (s40) of extracting a real part value as a real part resistance from the analysis target impedance; and a defect determination step (s50) of determining a defect of the analysis target battery based on the real part resistance, wherein the set frequency is selected from frequencies in which an imaginary part value of the analysis target impedance is greater than 0.

In the high-speed battery defect inspection methods of the present disclosure, the analysis target battery may include a plurality of monocells.

The monocell may be a unit cell having different types of electrodes located on both sides of the outermost surface when one or more cathodes and one or more anodes are stacked with a separator therebetween to form an electrode assembly. For example, a monocell may be a unit cell having an electrode assembly having a structure in which a cathode-separator-anode are stacked in that order. For another example, the monocell may be a unit cell having an electrode assembly having a structure in which a cathode-separator-anode-separator-cathode-separator-anode are stacked in that order.

The cathode may be a cathode current collector coated with a cathode active material.

The anode may be an anode current collector coated with an anode active material.

The separator may be an insulator through which ions pass.

In the analysis target impedance measurement step (s30), the set frequency may be from $10^{-2}$ kHz to 7 MHz. In the case of a low-voltage defective battery, it has an impedance value different from that of a normal battery at a high frequency, and in particular, shows a difference in a real component among impedance values.

When impedance spectroscopy (EIS) is performed on the battery, a graph of the complex plane as shown in FIG. 2 may be obtained. Specifically, in the impedance value corresponding to each frequency, a value obtained by multiplying an imaginary part by (−) and a value of the real part may be displayed as coordinates to obtain a Nyquist diagram as shown in FIG. 2. The high-speed battery defect inspection method of the present disclosure may be capable of high-speed discriminating low-voltage defects of a battery based on real part values in the second quadrant of the graph of FIG. 2.

FIG. 3 is a graph illustrating impedance spectroscopy measurement results for 15 batteries. In FIG. 3, five graphs of A_1, A_2, A_3, A_4 and A_5 are graphs for normal batteries, five graphs E_1, E_2, E_3, E_4, and E_5 are graphs for grade E defective batteries, and five graphs L_1, L_2, L_3, L_4, and L_5 are graphs for grade L defective batteries. The grade E defective battery may be a defective battery that exhibits absolute open circuit voltage (OCV) decrease. The grade L defective battery may be a defective battery that exhibits relative OCV decrease. In FIG. 3, it can be seen that the graphs of EIS measured values of low-voltage defective batteries (grade E defective batteries and grade L defective batteries) overlap each other regardless of the defect grade, but the graphs of normal batteries exhibit different behaviors from those of defective batteries. Specifically, at the measured impedance value of about 10 kHz, normal batteries appear in area A, and grade E defective batteries and grade L defective batteries appear in area B. In the case of grade E defective batteries and grade L defective batteries, it can be seen that they have a maximum value for the real part value in area B. Therefore, in the analysis target impedance measurement step (s30), the set frequency may be a frequency selected from $10^{-2}$ kHz to 7 MHz. More preferably, the set frequency may be a frequency selected from $10^{-1}$ kHz to $10^{2}$ kHz. In the frequency range of $10^{-2}$ kHz to 7 MHz, the low-voltage defective battery has an abnormal increase in the real part resistance value, and using this, it is possible to determine whether the battery is a low-voltage defective battery.

As shown in FIG. 4, high-speed battery defect inspection methods of the present disclosure may further include prior to the analysis target impedance measurement step (s30), a reference impedance measurement step (s10) of obtaining a plurality of reference impedances for a plurality of frequencies by applying alternating current to a reference battery while varying a frequency; and a set frequency calculation step (s20) of calculating the set frequency based on the plurality of reference impedances.

The high-speed battery defect inspection methods of the present disclosure may obtain an optimal set frequency capable of accurately detecting low-voltage defective batteries, by performing the reference impedance measurement step (s10) and the set frequency calculation step (s20), prior to the analysis target impedance measurement step (s30).

In the reference impedance measurement step (s10), as a low-voltage defective battery, the reference battery may have a delta open circuit voltage (dOCV) of 300 mV or greater or three sigma or more. The reference battery, which is a low-voltage defective battery, may be obtained as a battery that has been inspected as a defective battery in the mass production process or a battery subjected to defective conditions such as electrode folding and active material application area defect.

The reference impedance measurement step (s10) may be performed by impedance spectroscopy (EIS). Thus, a reference impedance value corresponding to each of the plurality of frequency values may be obtained.

As shown in FIG. 5, the set frequency calculation step (s20) may include a variable separation step (s21) of separating the plurality of reference impedances into real part values $Z_{SR}$ and imaginary part values $Z_{SI}$, a function fitting step (s22) of obtaining a function $f$ to the $Z_{SR}$ to the $Z_{SI}$, and a set frequency acquisition step (s23) of obtaining the set frequency based on the function.

In the function fitting step (s22) of the high-speed battery defect inspection methods of the present disclosure, the function $f$ may be fitted by Formula 1 below.

$$Z_{SR} = f(Z_{SI}). \quad \text{[Formula 1]}$$

In other words, in the function fitting step (s22), the function $f$ may be obtained in the form of a function in which real part values $Z_{SR}$ are dependent variables and imaginary part values $Z_{SI}$ are independent variables.

In the set frequency acquisition step (s23), the set frequency may be selected from frequencies satisfying Formula 2 below for a section in which $Z_{SI}$ has a value greater than 0.

$$-\varepsilon \leq \frac{df(Z_{SI})}{dZ_{SI}} \leq \varepsilon. \quad \text{[Formula 2]}$$

In certain embodiments, ε is a real number from 0.0 to 0.2. ε may be determined in consideration of tolerances of specifications and capacities of reference batteries, materials and structures of electrode materials, and the like. For another example, ε may be determined in consideration of a deviation value of reference impedance values obtained for a plurality of reference batteries.

In the set frequency step, & may be zero. In other words, a frequency when a value obtained by differentiating the function $f$ by $Z_{SI}$ is 0 may be obtained as the set frequency. More specifically, a frequency value when the function $f$ has a maximum value may be obtained as the set frequency.

In the defect determination step (s50), the analysis target battery, when the real part resistance is greater (e.g., 30% greater) with respect to a $Z_{SI}$ value satisfying Formula 2, may be determined as a defective battery. As described above for the low-voltage defective battery, the function $f$ may have a maximum value with respect to the set frequency, and the real part resistance value may have an abnormally large value. According to the experimental example to be described later, it may be seen that at the set frequency, the real part resistance value of the low-voltage defective battery is more than twice as large as the real part resistance value of the normal defective battery. Therefore, when the real part resistance is greater (e.g., is 30% or more or 50% or more) with respect to the $Z_{SI}$ values that satisfy Formula 2 above, the analysis target battery may be determined as a low-voltage defective battery.

A battery activation method applying a high-speed battery defect inspection method of the present disclosure may include

- an activation battery preparation step of preparing an activation target battery through an assembly process;
- a charging/discharging step of charging or discharging the activation target battery;
- a stabilization step of stabilizing the activation target battery by storing the activation target battery for a predetermined period of time at a set temperature and a set humidity; and
- a defect screening step of finally screening defective batteries by performing the high-speed battery defect inspection method using the activation target battery as the analysis target battery.

The activation target battery prepared in the activation battery preparation step may be a battery that has completed a packaging process.

By applying the high-speed battery defect inspection methods of the present disclosure to the battery activation process, the time required for battery defect inspection before shipment may be significantly reduced.

The battery activation methods of the present disclosure may further include between the activation battery preparation step and the charging/discharging step, a pre-inspection step of pre-inspecting the activation target battery by performing the high-speed inspection battery defect method of the present disclosure using the activation target battery as the analysis target battery.

The battery activation methods of the present disclosure may prevent the charging/discharging process and the aging process from being performed on the defective battery by primarily screening defective batteries before the charging/discharging process and the aging process, and defective batteries that may occur during the solid electrolyte interphase (SEI) layer formation process may be removed again by secondarily screening defective batteries after the aging process.

Experimental Examples

Fifteen batteries of 100 Ah with the activation process completed were prepared. Of these, five batteries are normal batteries, five batteries are grade E defective batteries, and five batteries are grade L defective batteries.

EIS was performed on fifteen batteries, and the results shown in FIG. 3 were obtained.

In the five normal batteries, the real part resistance values at a frequency of 10 kHz corresponding to the set frequency were measured as 500μΩ, 480μΩ, 470μΩ, 490 μΩ, and 520μΩ, respectively, in the five grade E defective batteries, the real part resistance values at a frequency of 10 kHz corresponding to the set frequency were measured as 1160μΩ, 1140μΩ, 1110μΩ, 1130μΩ and 1110μΩ, respectively, and in the five grade L defective batteries, the real part resistance values at a frequency of 10 kHz corresponding to the set frequency were measured as 1120μΩ, 1070μΩ, 1150μΩ, 1140μΩ, and 1170μΩ, respectively.

In other words, it may be seen that in the low-voltage defective battery, a real part resistance value that is twice or more larger than that of the normal battery at the set frequency is measured.

Although embodiments according to the present disclosure have been described above, they are only illustrative and those skilled in the art will understand that various modifications and embodiments of equivalent range are possible therefrom. Therefore, the true technical protection scope of the present disclosure should be defined by the following claims.

High-speed battery defect inspection methods of the present disclosure may detect low-voltage defective batteries in a short time, and may be capable of inspecting thousands to tens of thousands of batteries per second.

The high-speed battery defect inspection methods of the present disclosure are capable of performing non-destructive inspection on finished batteries, and may be applicable to batteries in mass production lines and batteries that have already been produced.

Compared to conventional methods, the high-speed battery defect inspection methods of the present disclosure significantly reduce inspection time, and may be capable of determining defects even in batteries that have not been inspected.

The invention claimed is:

1. A high-speed battery defect inspection method, comprising:

obtaining an analysis target impedance, wherein the analysis target impedance is an impedance of an analysis target battery measured by applying an alternating current at a set frequency to the analysis target battery;

extracting a real part resistance from the analysis target impedance; and determining a defect of the analysis target battery based on the real part resistance, wherein the set frequency is selected from frequencies in which an imaginary part value of the analysis target impedance is greater than 0.

2. The method of claim 1, wherein the set frequency is between $10^{-2}$ kHz and 7 MHz.

3. The method of claim 1, wherein the analysis target battery comprises a plurality of monocells.

4. The method of claim 1, further comprising:

prior to obtaining the analysis target impedance:

obtaining a plurality of reference impedances by applying an alternating current to a reference battery at varying frequencies; and calculating the set frequency based on the plurality of reference impedances.

5. The method of claim 4, wherein the reference battery has a dOCV of 300 mV or greater or three sigma or more.

6. The method of claim 4, wherein calculating the set frequency based on the plurality of reference impedances comprises:

separating the plurality of reference impedances into real part values $Z_{SR}$ and imaginary part values $Z_{SI}$, fitting a function $f$ to relate the real part values $Z_{SR}$ to the imaginary part values $Z_{SI}$, and obtaining the set frequency based on the function $f$.

7. The method of claim 6, wherein the function $f$ relates the real part values $Z_{SR}$ to the imaginary part values $Z_{SI}$ as:

$$Z_{SR} = f(Z_{SI}).$$

8. The method of claim 7, wherein in obtaining the set frequency based on the function $f$, the set frequency is selected from frequencies satisfying an equation:

$$-\varepsilon \leq \frac{df(Z_{SI})}{dZ_{SI}} \leq \varepsilon,$$

wherein ε is between 0.0 and 0.2, and a value of $Z_{SI}$ is greater than 0.

9. The method of claim 8, wherein ε equals 0.

10. The method of claim 9, wherein in determining the defect of the analysis target battery based on the real part resistance, the analysis target battery is determined as a defective battery when the real part resistance is at least 30% greater than an imaginary part value $Z_{SI}$ satisfying an equation $$-\varepsilon \leq \frac{df(Z_{SI})}{dZ_{SI}} \leq \varepsilon.$$

11. A battery activation method comprising:

assembling an activation target battery;

charging the activation target battery or discharging the activation target battery;

stabilizing the activation target battery by storing the activation target battery for a predetermined period of time at a set temperature and a set humidity; and determining a defect of the activation target battery according to the high-speed battery defect inspection method of claim 1.

12. The method of claim 11, further comprising:

between assembling the activation target battery and charging or discharging the activation target battery, pre-inspecting the activation target battery by determining a defect of the activation target battery according to the high-speed battery defect inspection method of claim 1.

13. The method of claim 11, wherein determining the defect of the activation target battery occurs between assembling the activation target battery and charging the activation target battery or discharging the activation target battery.

* * * * *